United States Patent
Kim et al.

(10) Patent No.: US 9,704,921 B2
(45) Date of Patent: Jul. 11, 2017

(54) ELECTRONIC DEVICE AND METHOD FOR FABRICATING THE SAME

(71) Applicant: SK hynix Inc., Icheon (KR)

(72) Inventors: Jong-Gi Kim, Icheon (KR); Ki-Jeung Lee, Icheon (KR); Beom-Yong Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 100 days.

(21) Appl. No.: 14/662,198

(22) Filed: Mar. 18, 2015

(65) Prior Publication Data

US 2016/0118442 A1    Apr. 28, 2016

(30) Foreign Application Priority Data

Oct. 27, 2014   (KR) ................ 10-2014-0146212

(51) Int. Cl.
| | | |
|---|---|---|
| *G06F 12/00* | (2006.01) | |
| *H01L 27/24* | (2006.01) | |
| *H01L 45/00* | (2006.01) | |
| *G06F 12/0802* | (2016.01) | |
| *G06F 13/16* | (2006.01) | |

(52) U.S. Cl.
CPC ...... *H01L 27/2427* (2013.01); *G06F 12/0802* (2013.01); *G06F 13/1663* (2013.01); *G06F 13/1673* (2013.01); *H01L 27/2409* (2013.01); *H01L 27/2436* (2013.01); *H01L 45/06* (2013.01); *H01L 45/08* (2013.01); *H01L 45/12* (2013.01); *H01L 45/1233* (2013.01); *H01L 45/141* (2013.01); *H01L 45/146* (2013.01); *H01L 45/147* (2013.01); *H01L 45/16* (2013.01); *G06F 2212/40* (2013.01)

(58) Field of Classification Search
CPC .. G06F 12/02; G06F 12/0802; G06F 13/1663; G06F 13/1673; H01L 27/2427; H01L 27/2409; H01L 27/2436; H01L 45/06
USPC .................................. 711/103, 101
See application file for complete search history.

(56) References Cited

U.S. PATENT DOCUMENTS

| | | | |
|---|---|---|---|
| 8,227,787 B2 | 7/2012 | Kumar et al. | |
| 9,312,269 B2* | 4/2016 | Kato | ................ H01L 27/11563 |
| 2005/0002263 A1* | 1/2005 | Iwase | .................... G11C 16/24 365/230.03 |
| 2011/0057161 A1* | 3/2011 | Sandhu | .................. H01L 45/06 257/2 |
| 2012/0074298 A1* | 3/2012 | Miyazawa | ........ H01L 27/14692 250/208.1 |
| 2013/0228733 A1* | 9/2013 | Lee | .................... H01L 29/6609 257/2 |
| 2013/0322162 A1* | 12/2013 | Lee | .................... G11C 11/1653 365/158 |
| 2014/0198564 A1* | 7/2014 | Guo | .................... G11C 11/161 365/158 |

(Continued)

FOREIGN PATENT DOCUMENTS

KR   10-2014-0081135   1/2014

*Primary Examiner* — Pierre-Michel Bataille

(57) ABSTRACT

Provided is an electronic device including a switching element, wherein the switching element may include a first electrode, a second electrode, a switching layer interposed between the first and second electrodes, and a first amorphous semiconductor layer interposed between the first electrode and the switching layer.

18 Claims, 7 Drawing Sheets

(56) References Cited

U.S. PATENT DOCUMENTS

| | | | |
|---|---|---|---|
| 2014/0287535 A1* | 9/2014 | Kim | H01L 45/1675 438/3 |
| 2014/0326942 A1* | 11/2014 | Oh | H01L 45/04 257/4 |
| 2015/0227738 A1* | 8/2015 | Katoh | G09C 1/00 713/168 |

* cited by examiner

ELECTRONIC DEVICE AND METHOD FOR FABRICATING THE SAME

CROSS-REFERENCE TO RELATED APPLICATIONS

The present application claims priority of Korean Patent Application No. 10-2014-0146212, entitled "ELECTRONIC DEVICE AND METHOD FOR FABRICATING THE SAME" and filed on Oct. 27, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a switching element having an excellent switching characteristic and reliability.

In an implementation, there is provided an electronic device including a switching element, wherein the switching element may include: a first electrode; a second electrode; a switching layer interposed between the first and second electrodes; and a first amorphous semiconductor layer interposed between the first electrode and the switching layer.

The first amorphous semiconductor layer includes a material chosen from silicon (Si) and germanium (Ge). The first amorphous semiconductor includes a material chosen from carbon (C), hydrogen (H), and nitrogen (N). The switching layer comprises niobium oxide, vanadium oxide, or a chalcogenide-based element. A second amorphous semiconductor layer interposed between the switching layer and the second electrode. A memory element which is electrically coupled to an end of the switching element, wherein the memory element comprises: a third electrode; a fourth electrode; and a variable resistance layer interposed between the third and fourth electrodes. A memory element which is electrically coupled to an end of the switching element, wherein the memory element comprises: a variable resistance layer formed over the second electrode; and a third electrode formed over the variable resistance layer. A plurality of first wrings extended in a first direction; a plurality of second wirings extended in a second direction crossing the first direction; and a plurality of memory cells arranged at intersections between the first and second wirings, wherein each of the memory cells comprises the switching element and the memory element.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable pattern is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable pattern is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable pattern is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable pattern is part of the memory or the buffer memory in the memory system.

In an implementation, a method for fabricating an electronic device including a switching element, comprising: forming a first electrode; forming a first amorphous semiconductor layer over the first electrode; and forming a switching layer over the first amorphous semiconductor layer.

The first amorphous semiconductor layer comprises a material chosen from Si and Ge. The first amorphous semiconductor layer comprises an impurity chosen from C, H, and N. The method may further include: forming a second amorphous semiconductor layer over the switching layer; and forming a second electrode over the second amorphous semiconductor layer. The method may further include: forming a variable resistance layer over the second electrode.

DETAILED DESCRIPTION

Figure 1:
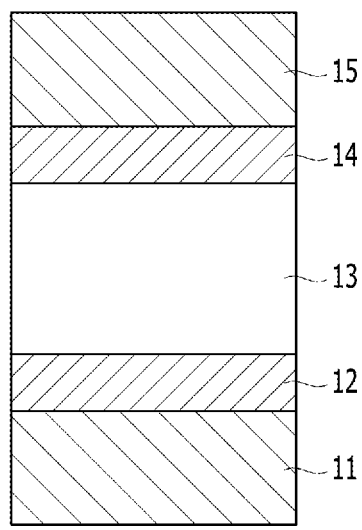
FIG. 1 is a cross-sectional view for explaining a switching element and a method for fabricating the same in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Before the drawings are described, a switching element and a memory element in accordance with an implementation will be briefly described.

The switching element may indicate an element which is turned on to pass a current or turned off to interrupt a current, and include a diode, a transistor, a tunnel barrier formed of an insulating material, an MIT (Metal Insulator Transition) element, a varistor, an OTS (Ovonic Threshold Switching) element and the like. The switching element may be coupled in series to an end of the memory element. In this case, the switching element may function as a selecting element for controlling an access to a memory element.

The memory element may store data using a variable resistance characteristic in which it transitions between different resistance states according to an applied voltage or current. The memory element may include two electrodes for applying a voltage and a variable resistance material interposed between the two electrodes. The variable resistance material may include a single layer or multiple layers containing various materials used for RRAM, PRAM, FRAM, MRAM and the like. For example, the various materials may include a transition metal oxide, a metal oxide such as a perovskite-based material, a phase change material such as a chalcogenide-based material, a ferrodielectric material, and a ferromagnetic material.

The switching element and the memory element which are coupled to each other may form a unit memory cell. A plurality of memory cells may be arranged in various ways and form a cell array. In particular, a cell array including a plurality of memory cells formed at the intersections between wirings crossing each other, for example, between source lines and bit lines may be referred to as a cross-point cell array.

Figure 2:
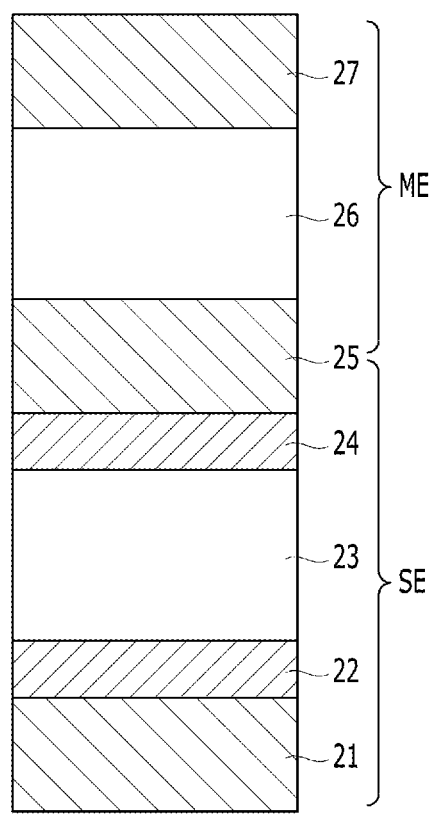
FIG. 2 is a cross-sectional view for explaining a memory cell in accordance with an implementation.
Figure 3:
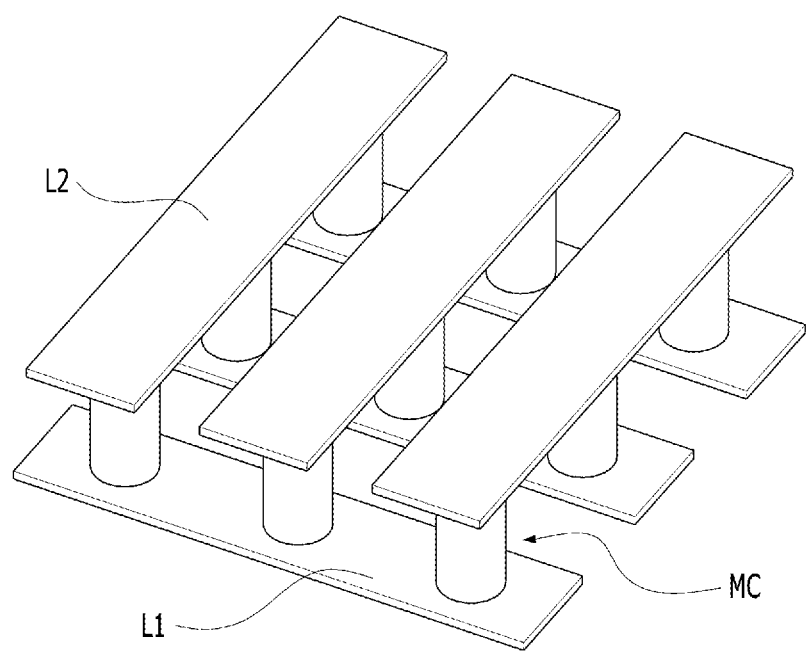
FIG. 3 is a perspective view for explaining a cell array in accordance with an implementation.

Hereafter, referring to FIG. 1, a switching element in accordance with an implementation will be described. Referring to FIG. 2, a memory cell in accordance with an implementation will be described. Referring to FIG. 3, a cell array in accordance with an implementation will be described.

FIG. 1 is a cross-sectional view for explaining a switching element and a method for fabricating the same in accordance with an implementation.

As illustrated in FIG. 1, the switching element in accordance with the implementation may include a stacked structure of a first electrode 11, a first amorphous semiconductor layer 12, a switching layer 13, a second amorphous semiconductor layer 14, and a second electrode 15.

The switching element may be formed by sequentially stacking the first electrode 11, the first amorphous semiconductor layer 12, the switching layer 13, the second amorphous semiconductor layer 14, and the second electrode 15 and then patterning the stacked structure.

The first and second electrodes 11 and 15 may serve to apply a voltage to the switching layer 13. The first and second electrodes 11 and 15 may include a conductive material. For example, the first and second electrodes 11 and 15 may be formed of a metal, a metal nitride, polysilicon doped with impurity, or a combination thereof.

The switching layer 13 may be formed of a material through which current flows or does not flow, which correspond to on and off switch states, according to a voltage applied between the two electrodes 11 and 15 positioned on opposing sides of the switch. The switching layer 13 may include a niobium oxide, a vanadium oxide, or an OTS (Ovonic Threshold Switch) material having a chalcogenide-based element such as As, Te, Ge, Sb, or Se.

In the present implementation, the amorphous semiconductor layers 12 and 14 may be interposed as barrier layers between the electrodes 11 and 15 and the switching layer 13, in order to reduce of the amount of current that flows through the switching element in an off state. In the implementation shown in FIG. 1, the first and second amorphous semiconductor layers 12 and 14 are interposed between the respective electrodes and the switching element. However, in another implementation, a single amorphous semiconductor layer may be selectively interposed between the first electrode 11 and the switching layer 13 or between the switching layer 13 and the second electrode 15.

The first and second amorphous semiconductor layers 12 and 14 may include a material chosen from Si and Ge. In other words, an amorphous semiconductor may include Si, Ge, or a combination of Si and Ge. Furthermore, the first and second amorphous semiconductor layers 12 and 14 may include an impurity chosen from C, H, and N, in addition to the above-described semiconductor material. In other implementations, the first and second amorphous semiconductor layers 12 and 14 may include other semiconductor materials. In some implementations, the first and second amorphous semiconductor layers 12 and 14 may be doped with impurities or the bandgap or conductivity thereof may be controlled by adjusting a composition ratio, such as a ratio between Ge and Si, and may be formed of a single material layer or multiple layers of different materials.

In a resistance element in which switching behavior occurs due to oxygen vacancies and a switching element has an MIT characteristic, when an oxide is applied as a barrier layer, oxygen vacancies may be formed which affect a switching operation. On the other hand, in the present implementation, amorphous semiconductor layers 12 and 14 having no oxygen vacancies therein are applied as barrier layers. Thus, the amorphous semiconductor layers 12 and 14 may have little or no effect on a switching operation of the switching element or the resistance element. Furthermore, since the amorphous semiconductor layers 12 and 14 have a high maximum current density, the occurrence of break down or the like may be prevented.

Furthermore, the amorphous semiconductor layers 12 and 14 may follow the behavior of the barrier layer under a low voltage condition, and follow the behavior of the resistance element or switching element under a high voltage condition, which makes it possible to develop a resistance element or switching element having a low current Ioff when a voltage below the threshold voltage is applied to the switch in an off state, and good non-linearity. Furthermore, in some implementations, the amorphous semiconductor layers 12 and 14 may have different bandgap or conductivity characteristics according to a process condition such as impurity doping or composition ratio adjustment, so that various implementations may be adapted to suit various applications. Thus, it is possible to form a reliable element.

FIG. 2 is a cross-sectional view for explaining a memory cell in accordance with an implementation.

As illustrated in FIG. 2, the memory cell in accordance with the implementation may include a switching element SE and a memory element ME which are coupled in series to each other.

The switching element SE may be configured in substantially the same manner as the switching element of FIG. 1.

That is, the switching element SE may include a stacked structure of a first electrode 21, a first amorphous semiconductor layer 22, a switching layer 23, a second amorphous semiconductor layer 24, and a second electrode 25.

The memory element ME may include two electrodes 25 and 27 and a variable resistance layer 26 interposed therebetween. FIG. 2 shows an implementation in which the memory element ME and the switching element SE share one electrode 25, but implementations are not limited thereto. For example, in other implementations, memory element ME and the switching element SE may not share the second electrode 25. In such an implementation, an additional electrode (not illustrated) may be further interposed between the second electrode 25 and the variable resistance layer 26. The third electrode 27 of the memory element ME and/or the additional electrode may be formed of the same material as the first and second electrodes 21 and 25.

The variable resistance layer 26 may have one or more layer containing a material capable of transitioning between a high resistance state and a low resistance state. For example, the material may include various materials used for RRAM, PRAM, FRAM, MRAM and the like. In particular, the variable resistance layer 26 may include a metal oxide containing oxygen vacancies. In this case, because generation or disappearance of a current path filament within the variable resistance layer 26 occurs due to the behavior of oxygen vacancies, the variable resistance layer 26 may have a high resistance state or low resistance state. Implementations of this disclosure are not limited thereto, but may include all kinds of materials which exhibit a resistance switching characteristic according to a current or voltage supplied through the switching element SE.

FIG. 3 is a perspective view for explaining a cell array in accordance with an implementation.

As illustrated in FIG. 3, a cell array in accordance with an embodiment of the present disclosure may include a plurality of first wirings L1, a plurality of second wirings L2, and a plurality of memory cells MC. The plurality of first wirings L1 may extend in a first direction, the plurality of second wirings L2 may be separated from the plurality of first wirings L1, and extend in a second direction crossing the plurality of first wirings L1, and the memory cells MC may be arranged at intersections between the first wirings L1 and the second wirings L2.

The first and second wirings L1 and L2 may include various conductive materials such as metal and metal oxide, and particularly a low-resistance conductive material.

The memory cell MC may be configured in substantially the same manner as the memory cell of FIG. 2.

In such a cell array, because wirings are coupled to a plurality of cells, unselected cells may experience a current along with a selected cell. Thus, without the switching element in accordance with the present implementation, a sneak current would flow to an unselected memory cell MC which shares the first or second wiring L1 or L2 with the selected memory cell MC. In the present implementation, the switching element SE which has an excellent switching characteristic and effectively reduces the amount of current that can flow across the switch in an off state by applying an amorphous semiconductor layer as a barrier layer may be coupled to the memory element, thereby preventing the sneak current.

In the embodiment of FIG. 3, the memory cell MC of FIG. 2 is interposed between the first and second wirings L1 and L2. However, implementations are not limited thereto. For example, in another implementation, the first electrode 21 and/or the first amorphous semiconductor layer 22 of the switching element SE of FIG. 2 may have a line shape in place of the first wiring L1, and the third electrode 27 of the memory element ME may have a line shape in place of the second wiring L2.

In accordance with implementations of this disclosure, it is possible to provide a switching element which has an excellent switching characteristic and reliability.

The above and other memory circuits or semiconductor devices based on the disclosed technology can be used in a range of devices or systems. FIGS. 4-8 provide some examples of devices or systems that can implement the memory circuits disclosed herein.

Figure 4:
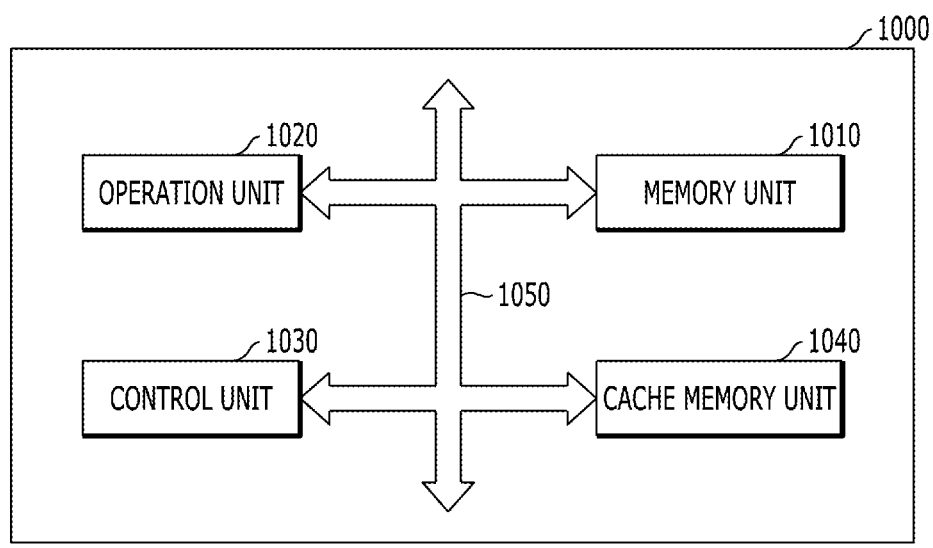
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first electrode; a second electrode; a switching layer interposed between the first and second electrodes; and a first amorphous semiconductor layer interposed between the first electrode and the switching layer. Through this, a fabrication process of the memory unit 1010 may be performed to improve the data storage characteristic of the memory unit 1010. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
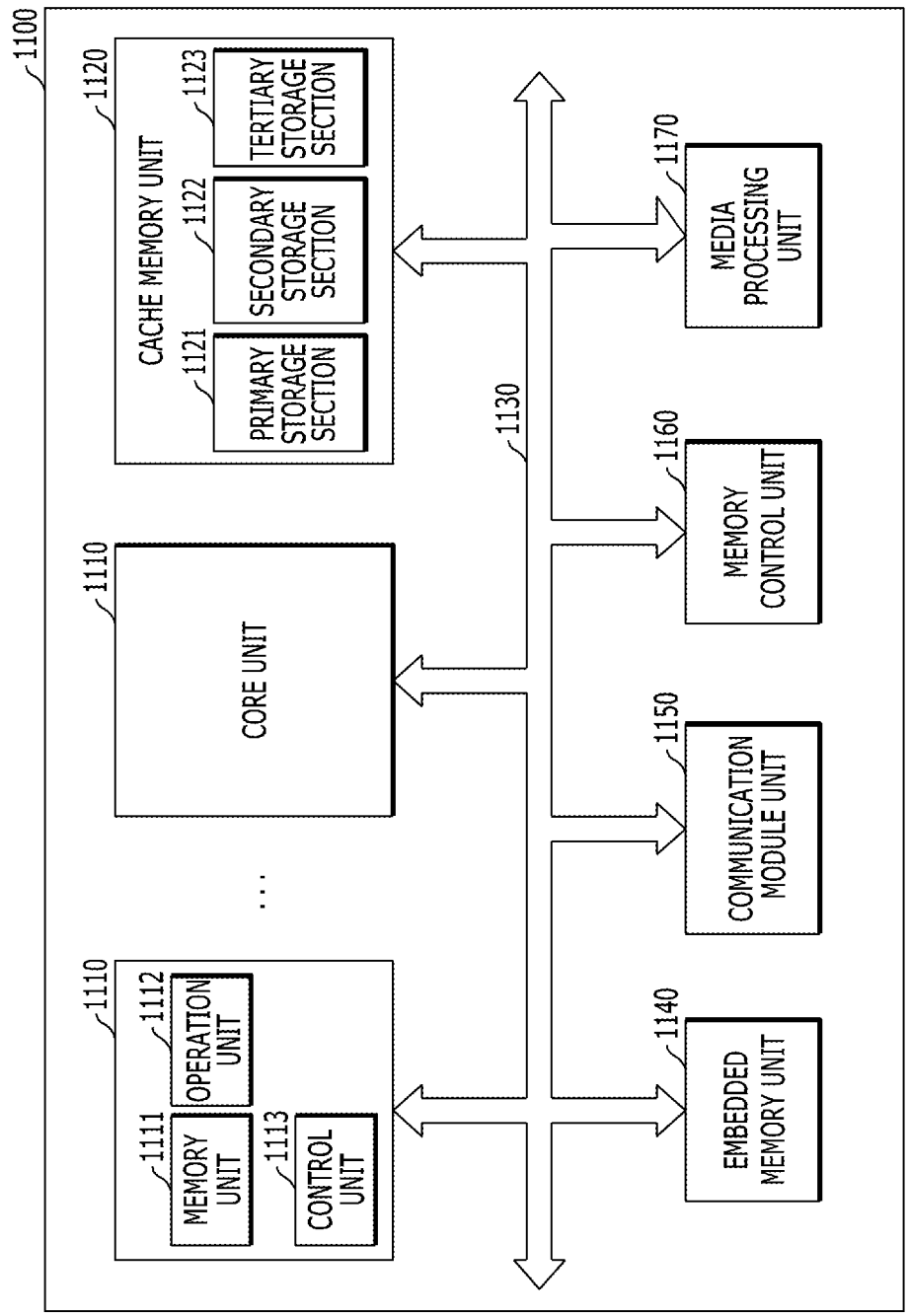
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first electrode; a second electrode; a switching layer interposed between the first and second electrodes; and a first amorphous semiconductor layer interposed between the first electrode and the switching layer. Through this, a fabrication process of the memory unit 1120 may be performed to improve the data storage characteristic of the memory unit 1120. As a consequence, operating characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
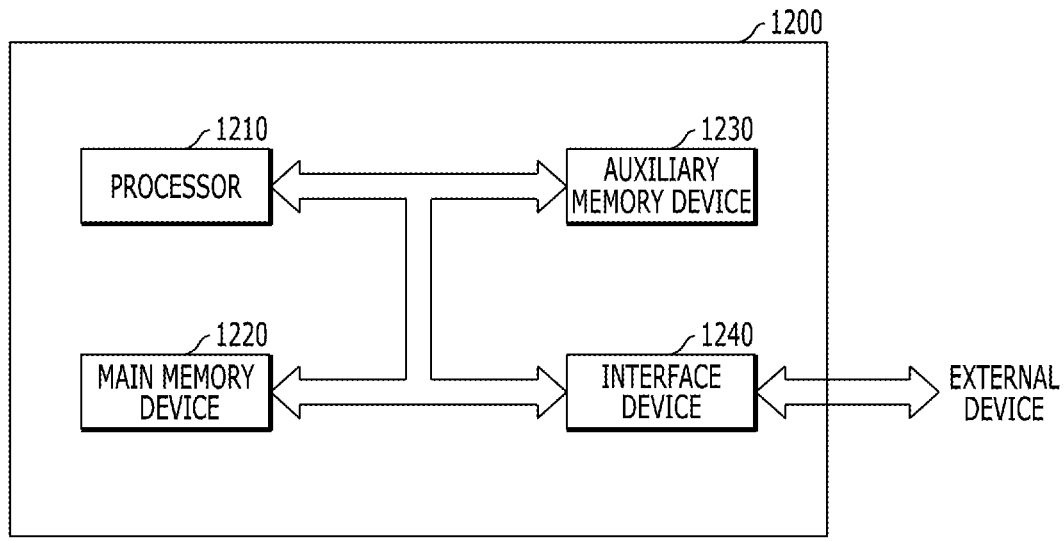
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first electrode; a second electrode; a switching layer interposed between the first and second electrodes; and a first amorphous semiconductor layer interposed between the first electrode and the switching layer. Through this, a fabrication process of the memory unit 1220 may be performed to improve the data storage characteristic of the memory unit 1220. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first electrode; a second electrode; a switching layer interposed between the first and second electrodes; and a first amorphous semiconductor layer interposed between the first electrode and the switching layer. Through this, a fabrication process of the memory unit 1230 may be performed to improve the data storage characteristic of the memory unit 1230. As a consequence, operating characteristics of the system 1200 may be improved.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
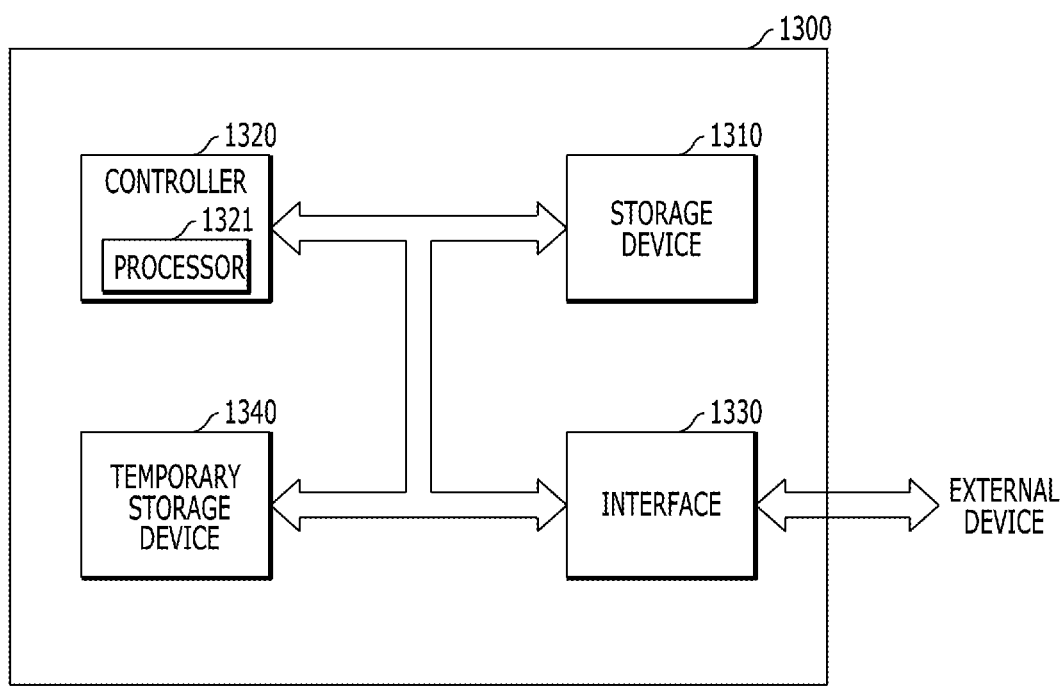
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first electrode; a second electrode; a switching layer interposed between the first and second electrodes; and a first amorphous semiconductor layer interposed between the first electrode and the switching layer. Through this, a fabrication process of the storage device 1310 or the temporary storage device 1340 may be performed to improve the data storage characteristic of the storage device 1310 or the temporary storage device 1340. As a consequence, operating characteristics of the data storage system 1300 may be improved.

Figure 8:
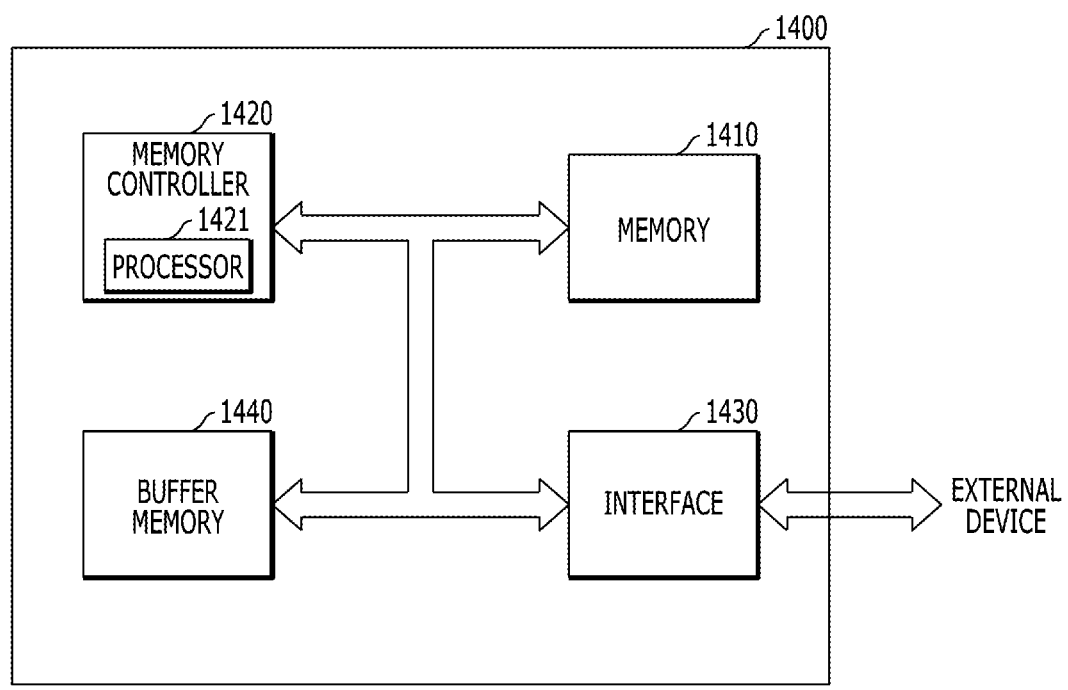
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first electrode; a second electrode; a switching layer interposed between the first and second electrodes; and a first amorphous semiconductor layer interposed between the first electrode and the switching layer. Through this, a fabrication process of the memory 1410 may be performed to improve the data storage characteristic of the memory 1410. As a consequence, operating characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first electrode; a second electrode; a switching layer interposed between the first and second electrodes; and a first amorphous semiconductor layer interposed between the first electrode and the switching layer. Through this, a fabrication process of the buffer memory may be performed to improve the data storage characteristic of the buffer memory. As a consequence, operating characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device with a switching element, the switching element comprising:
   a first electrode;
   a switching layer formed over the first electrode;
   a second electrode formed over the switching layer;
   a first amorphous semiconductor layer interposed between the first electrode and the switching layer; and
   a second amorphous semiconductor layer interposed between the switching layer and the second electrode,
   wherein the switching layer is formed between the first amorphous semiconductor layer and the second amorphous semiconductor layer.

2. The electronic device of claim 1, wherein the first amorphous semiconductor layer includes a material chosen from silicon (Si) and germanium (Ge).

3. The electronic device of claim 1, wherein the first amorphous semiconductor includes a material chosen from carbon (C), hydrogen (H), and nitrogen (N).

4. The electronic device of claim 1, wherein the switching layer comprises niobium oxide, vanadium oxide, or a chalcogenide-based element.

5. The electronic device of claim 1, further comprising a second amorphous semiconductor layer interposed between the switching layer and the second electrode.

6. The electronic device of claim 1, further comprising a memory element which is electrically coupled to an end of the switching element, the memory element comprising:
   a third electrode;
   a fourth electrode; and
   a variable resistance layer interposed between the third and fourth electrodes.

7. The electronic device of claim 1, further comprising a memory element which is electrically coupled to an end of the switching element, the memory element comprising:
   a variable resistance layer formed over the second electrode; and
   a third electrode formed over the variable resistance layer.

8. The electronic device of claim 6, further comprising:
   a plurality of first wrings extended in a first direction;
   a plurality of second wirings extended in a second direction crossing the first direction; and
   a plurality of memory cells arranged at intersections between the first and second wirings, wherein each memory cell of the plurality of memory cells comprises the switching element and the memory element.

9. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory unit is part of the memory unit in the microprocessor.

10. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit is part of the cache memory unit in the processor.

11. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory unit is part of the auxiliary memory device or the main memory device in the processing system.

12. The electronic device according to claim 1, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside,
- wherein the semiconductor memory unit is part of the storage device or the temporary storage device in the data storage system.

13. The electronic device according to claim 1, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside,
- wherein the semiconductor memory unit is part of the memory or the buffer memory in the memory system.

14. A method for fabricating an electronic device including a switching element, the method comprising:
- forming a first electrode;
- forming a first amorphous semiconductor layer over the first electrode;
- forming a switching layer over the first amorphous semiconductor layer; and
- forming a second amorphous semiconductor layer over the switching layer,
- wherein the switching layer is formed between the first amorphous semiconductor layer and the second amorphous semiconductor layer.

15. The method of claim 14, wherein the first amorphous semiconductor layer comprises a material chosen from Si and Ge.

16. The method of claim 14, wherein the first amorphous semiconductor layer comprises an impurity chosen from C, H, and N.

17. The method of claim 14, further comprising:
- forming a second electrode over the second amorphous semiconductor layer.

18. The method of claim 14, further comprising forming a variable resistance layer over the second electrode.

* * * * *